(12) United States Patent
Abdel Fattah et al.

(10) Patent No.: US 11,374,803 B2
(45) Date of Patent: Jun. 28, 2022

(54) QUADRATURE ERROR CORRECTION FOR RADIO TRANSCEIVERS

(71) Applicant: Analog Devices, Inc., Norwood, MA (US)

(72) Inventors: Omar A S Abdel Fattah, Madison, NJ (US); Christoph M. Steinbrecher, Pennington, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/949,591

(22) Filed: Nov. 5, 2020

(65) Prior Publication Data

US 2022/0123975 A1  Apr. 21, 2022

Related U.S. Application Data

(60) Provisional application No. 63/092,740, filed on Oct. 16, 2020.

(51) Int. Cl.
*H03H 7/30* (2006.01)
*H03H 7/40* (2006.01)
(Continued)

(52) U.S. Cl.
CPC ..... *H04L 27/0014* (2013.01); *H03F 3/45475* (2013.01); *H03G 3/3036* (2013.01);
(Continued)

(58) Field of Classification Search
CPC ......... H04L 27/0014; H04L 2027/0016; H04L 27/22; H04B 1/38; H03F 3/45475;
(Continued)

(56) References Cited

U.S. PATENT DOCUMENTS

| 5,293,406 A | 3/1994 | Suzuki |
| 5,705,949 A | 1/1998 | Alelyunas et al. |

(Continued)

FOREIGN PATENT DOCUMENTS

| CN | 104348494 B | 5/2017 |
| EP | 2367332 A1 | 9/2011 |

(Continued)

OTHER PUBLICATIONS

Anderson et al., "A 4.75-34.75 MHz Digitally Tunable Active-RC LPF for >60 dB Mean RX IRR in 65 nm CMOS" IEEE Xplore 2012, in 4 pages.

(Continued)

*Primary Examiner* — Phuong Phu
(74) *Attorney, Agent, or Firm* — Knobbe, Martens, Olson & Bear, LLP

(57) ABSTRACT

Quadrature error correction (QEC) for radio transceivers are provided herein. In certain embodiments, a transceiver includes an in-phase (I) signal path including a first controllable amplifier coupled to a first data converter, and a quadrature-phase (Q) signal path including a second controllable amplifier coupled to a second data converter. The transceiver further includes a QEC circuit operable to correct for a quadrature error between the I signal path and the Q signal path by adjusting a gain of the first controllable amplifier and/or a gain of the second controllable amplifier.

20 Claims, 8 Drawing Sheets

(51) Int. Cl.
*H03K 5/159* (2006.01)
*H04L 27/00* (2006.01)
*H04B 1/38* (2015.01)
*H03F 3/45* (2006.01)
*H03G 3/30* (2006.01)

(52) U.S. Cl.
CPC ......... *H04B 1/38* (2013.01); *H03F 2200/129* (2013.01); *H03F 2200/294* (2013.01); *H03F 2200/451* (2013.01); *H03F 2203/45116* (2013.01); *H03G 2201/103* (2013.01); *H03G 2201/307* (2013.01); *H04L 2027/0016* (2013.01)

(58) Field of Classification Search
CPC ..... H03F 2200/129; H03F 2203/45116; H03F 2200/451; H03F 2200/294; H03G 3/3036; H03G 2201/307; H03G 2201/103; H03G 3/3052
USPC .......................... 375/235, 296, 346, 284, 285
See application file for complete search history.

(56) References Cited

U.S. PATENT DOCUMENTS

| | | | |
|---|---|---|---|
| 6,377,620 B1 * | 4/2002 | Ozluturk | ................ H04L 27/22 375/235 |
| 6,891,440 B2 | 5/2005 | Straub et al. | |
| 6,977,977 B1 | 12/2005 | Dubrovin et al. | |
| 7,035,341 B2 | 4/2006 | Mohindra | |
| 7,181,205 B1 | 2/2007 | Scott et al. | |
| 7,248,625 B2 | 7/2007 | Chien | |
| 7,856,048 B1 | 12/2010 | Smaini et al. | |
| 7,894,555 B2 | 2/2011 | Lindoff et al. | |
| 7,894,772 B2 | 2/2011 | Aoki | |
| 7,944,984 B1 | 5/2011 | Wu et al. | |
| 8,036,317 B2 | 10/2011 | D'Alessandro | |
| 8,085,863 B2 | 12/2011 | Gupta | |
| 8,290,450 B2 | 10/2012 | Hammerschmidt et al. | |
| 8,331,506 B2 | 12/2012 | Park et al. | |
| 8,380,145 B2 | 2/2013 | Pratt et al. | |
| 8,509,298 B2 | 8/2013 | Hormis | |
| 8,514,914 B2 * | 8/2013 | Yokoo | ................ H04L 27/0014 375/219 |
| 8,706,062 B1 | 4/2014 | Yu et al. | |
| 8,861,644 B2 | 10/2014 | Chen et al. | |
| 8,953,663 B2 | 2/2015 | Kravitz | |
| 9,300,444 B2 | 3/2016 | Hormis et al. | |
| 9,356,732 B2 | 5/2016 | Schubert et al. | |
| 9,391,578 B2 | 7/2016 | Khan et al. | |
| 9,444,560 B1 | 9/2016 | Goh | |
| 9,673,847 B1 | 6/2017 | Mayer et al. | |
| 2001/0022532 A1 | 9/2001 | Dolman | |
| 2002/0086651 A1 * | 7/2002 | Prentice | ................ H03G 3/3052 455/234.1 |
| 2004/0092241 A1 | 5/2004 | Kim et al. | |
| 2004/0198340 A1 | 10/2004 | Lee et al. | |
| 2005/0069050 A1 | 3/2005 | Ding et al. | |
| 2005/0260949 A1 | 11/2005 | Kiss et al. | |
| 2006/0062324 A1 | 3/2006 | Masashi et al. | |
| 2006/0109893 A1 | 5/2006 | Chen et al. | |
| 2006/0121858 A1 | 6/2006 | Tanaka et al. | |
| 2006/0164161 A1 | 7/2006 | Schwoerer | |
| 2006/0215783 A1 | 9/2006 | Shako et al. | |
| 2007/0211822 A1 | 9/2007 | Olesen et al. | |
| 2007/0263745 A1 | 11/2007 | Hayase et al. | |
| 2007/0286307 A1 | 12/2007 | Hayashi et al. | |
| 2008/0166985 A1 | 7/2008 | Wortel et al. | |
| 2008/0195920 A1 | 8/2008 | Luce et al. | |
| 2009/0002823 A1 | 1/2009 | Law et al. | |
| 2009/0028231 A1 | 1/2009 | Lee et al. | |
| 2009/0224828 A1 | 9/2009 | Hideharu et al. | |
| 2009/0233562 A1 | 9/2009 | Kim et al. | |
| 2009/0240917 A1 | 9/2009 | Fitton | |
| 2009/0325516 A1 | 12/2009 | Safavi | |
| 2010/0119012 A1 | 5/2010 | Pal | |
| 2010/0316163 A1 | 12/2010 | Forenza et al. | |
| 2011/0013724 A1 | 1/2011 | Metreaud et al. | |
| 2011/0075715 A1 | 3/2011 | Kravitz | |
| 2012/0087451 A1 | 4/2012 | Razzell | |
| 2012/0126821 A1 | 5/2012 | Forstner | |
| 2012/0314784 A1 | 12/2012 | Pratt et al. | |
| 2013/0021048 A1 | 1/2013 | Peng et al. | |
| 2013/0272175 A1 | 10/2013 | Zargari et al. | |
| 2014/0154997 A1 | 6/2014 | Chen et al. | |
| 2014/0270001 A1 | 9/2014 | Schubert et al. | |
| 2014/0270002 A1 | 9/2014 | Schubert et al. | |
| 2014/0273902 A1 | 9/2014 | An et al. | |
| 2015/0030103 A1 | 1/2015 | Hormis et al. | |
| 2016/0033563 A1 | 2/2016 | Needham et al. | |
| 2020/0041269 A1 | 2/2020 | Strandjord et al. | |

FOREIGN PATENT DOCUMENTS

| | | |
|---|---|---|
| JP | 2013197883 A | 9/2013 |
| JP | 2016208091 A | 12/2016 |
| JP | 6408291 B2 | 10/2018 |
| KR | 101455894 B1 | 11/2014 |
| KR | 10-2020-0069201 A | 6/2020 |
| RU | 2011123470 A | 1/2013 |
| WO | WO 2014145350 A1 | 9/2014 |

OTHER PUBLICATIONS

Narasimhan et al., "Digital Compensation of Tx/Rx I/Q Imbalance in TD-SCDMA Systems," Global Telecommunication Conference (Globecom) 2011, IEEE, Dec. 5, 2011, pp. 1-5.
International Search Report and Written Opinion for International Application No. PCT/US2021/071571 dated Jan. 6, 2022, in 10 pages.

* cited by examiner

BEFORE QEC

AFTER QEC

QUADRATURE ERROR CORRECTION FOR RADIO TRANSCEIVERS

CROSS-REFERENCE TO RELATED APPLICATIONS

The present application claims priority to U.S. Provisional Patent Application No. 63/092,740, filed Oct. 16, 2020, and titled "QUADRATURE ERROR CORRECTION FOR RADIO TRANSCEIVERS," the entirety of which is hereby incorporated herein by reference.

FIELD OF THE DISCLOSURE

Embodiments of the invention relate to electronic systems, and more particularly to, quadrature error correction in radio frequency communication systems.

DESCRIPTION OF THE RELATED TECHNOLOGY

A radio transceiver can be used in a wide variety of radio frequency (RF) communication systems. For example, transceivers can be included in base stations or mobile devices to transmit and receive signals associated with a wide variety of communications standards, including, for example, cellular and/or wireless local area network (WLAN) standards. Transceivers can also be used in radar systems, instrumentation, industrial electronics, military electronics, laptop computers, digital radios, and/or other electronics.

A transmit or receive channel of an RF communication system can be calibrated to compensate for impairments, thereby enhancing the RF communication system's performance.

SUMMARY OF THE DISCLOSURE

Quadrature error correction (QEC) for radio transceivers are provided herein. In certain embodiments, a transceiver includes an in-phase (I) signal path including a first controllable amplifier coupled to a first data converter, and a quadrature-phase (Q) signal path including a second controllable amplifier coupled to a second data converter. The transceiver further includes a QEC circuit operable to correct for a quadrature error between the I signal path and the Q signal path by adjusting a gain of the first controllable amplifier and/or a gain of the second controllable amplifier. By implementing the transceiver in this manner, quadrature error is reduced. Moreover such a QEC scheme provides enhanced performance relative to an implementation in which only feedback capacitance settings (for instance, an amplifier feedback capacitor setting) are adjusted for QEC. For example, capacitance settings can have limited resolution and/or degraded accuracy in the presence of parasitic capacitances, and thus provide only a coarse correction.

In one aspect, a transceiver with QEC correction is provided. The transceiver includes an I signal path including a first amplifier coupled to a first data converter, a Q signal path including a second amplifier coupled to a second data converter, and a QEC circuit configured to correct for a quadrature error between the I signal path and the Q signal path by adjusting a gain of at least one of the first amplifier or the second amplifier.

In another aspect, a method of QEC in a transceiver is provided. The method includes processing an I signal using an I signal path that includes a first amplifier coupled to a first data converter, processing a Q signal using a Q signal path that includes a second amplifier coupled to a second data converter, and correcting for a quadrature error between the I signal path and the Q signal path by adjusting a gain of at least one of the first amplifier or the second amplifier.

In another aspect, a radio frequency (RF) communication system including a transceiver and a front-end system is provided. The transceiver includes an I signal path including a first amplifier coupled to a first data converter, a Q signal path including a second amplifier coupled to a second data converter, and a QEC circuit configured to correct for a quadrature error between the I signal path and the Q signal path by adjusting a gain of at least one of the first amplifier or the second amplifier. The front-end system is configured to receive an RF transmit signal from the transceiver and to provide an RF receive signal to the transceiver.

DETAILED DESCRIPTION

Figure 1:
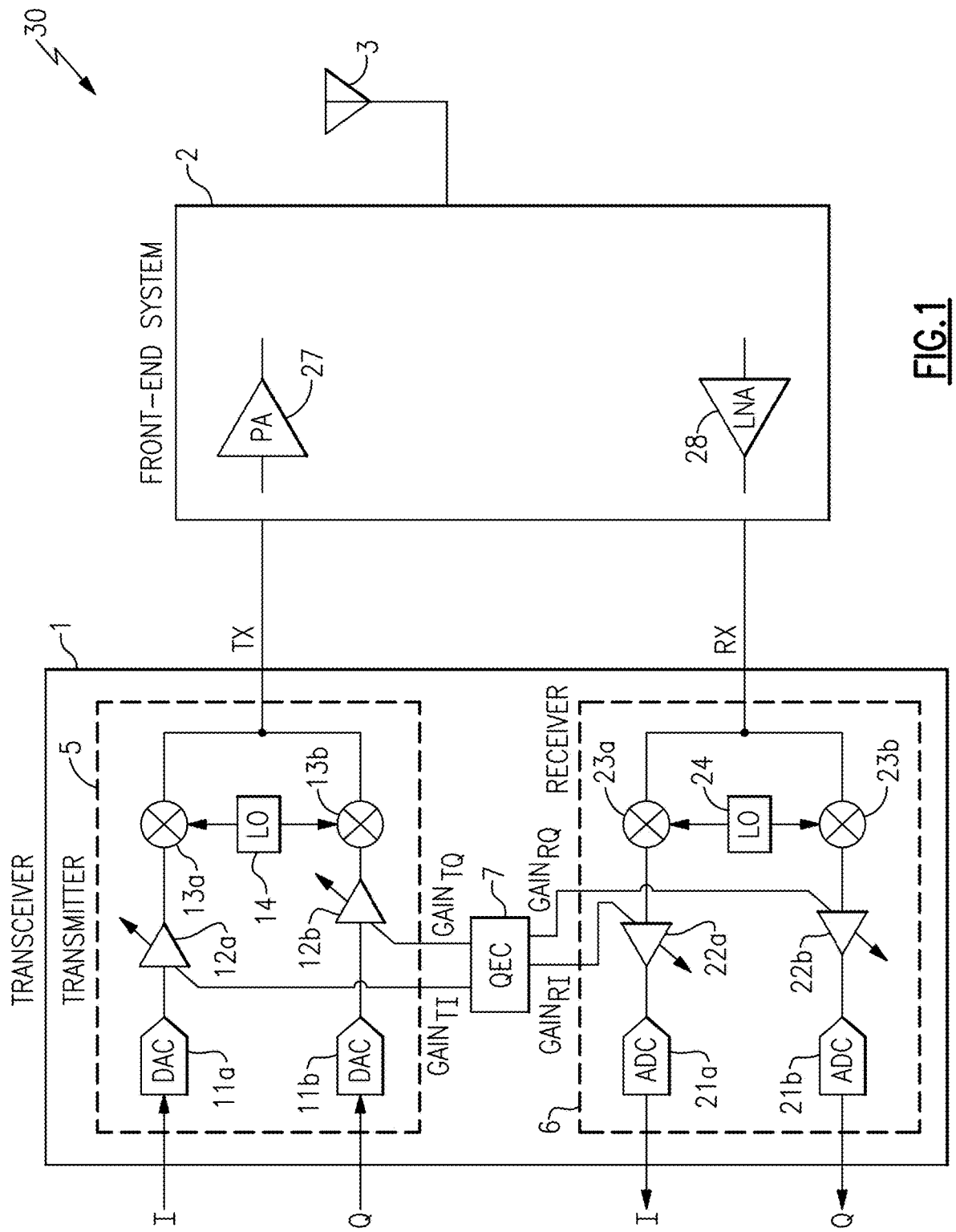
FIG. 1 is a schematic diagram of one embodiment of a radio frequency (RF) communication system.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A radio frequency (RF) communication system, such as a direct conversion quadrature radio, can suffer from a variety of impairments. Absent calibration, the impairments can lead to transmit errors, receive errors, and/or other performance degradation.

For example, a direct conversion quadrature radio can be used to process in-phase (I) and quadrature-phase (Q) signals, which ideally have a phase separation of exactly 90°. However, one or more components of the direct conversion quadrature radio can have quadrature error. For example, a local oscillator can have a quadrature error that can be symmetric with respect to frequencies above and below the local oscillator's center frequency. Moreover, mixers used for frequency shifting of transmit or receive signals can likewise have quadrature error. Furthermore, delay and/or gain differences of data converters used in I and Q paths can generate quadrature error.

Absent calibration, the transceiver impairments can degrade the RF communication system's performance including, for example, by decreasing image rejection, degrading error vector magnitude (EVM), reducing receive sensitivity, and/or failing out of band emissions specifications.

Quadrature error correction (QEC) for radio transceivers are provided herein. In certain embodiments, a transceiver includes an in-phase (I) signal path including a first controllable amplifier coupled to a first data converter, and a quadrature-phase (Q) signal path including a second controllable amplifier coupled to a second data converter. The transceiver further includes a QEC circuit operable to correct for a quadrature error between the I signal path and the Q signal path by adjusting a gain of the first controllable amplifier and/or a gain of the second controllable amplifier.

By implementing the transceiver in this manner, quadrature error is reduced. Moreover such a QEC scheme provides enhanced performance relative to an implementation in which only feedback capacitance settings (for instance, an amplifier feedback capacitor setting) are adjusted for QEC. For example, capacitance settings can have limited resolution and/or degraded accuracy in the presence of parasitic capacitances, and thus provide only a coarse correction.

The QEC correction can be applied to the transceiver's transmitter(s) and/or receiver(s). For example, in the context of a receiver, an output of the first controllable amplifier can drive an input of a first analog-to-digital converter (ADC) while an output of the second controllable amplifier can drive an input of a second ADC. In the context of a transmitter, an output of a first digital-to-analog converter (DAC) can drive an input of the first controllable amplifier while an output of a second DAC can drive an input of the second controllable amplifier.

The matching between the frequency response of the I and Q paths can be improved by tuning the gain of the amplifiers in the I and Q paths, thereby tuning the loop gain at frequencies of interest.

In certain implementations, the first controllable amplifier and the second controllable amplifier are each implemented as a transimpedance amplifier (TIA), and the QEC circuits adjust a transconductance of each TIA to compensate for quadrature error. As persons having ordinary skill in the art will appreciate, a TIA serves as a current-to-voltage converter, and thus receives an input current and provided an output voltage.

The gain of amplifiers (such as TIAs) can be adjusted in a wide variety of ways, including, but not limited to, by adjusting bias current, by adjusting amplifier size (for instance, a transistor width or a number of active transistors), and/or by adjusting a frequency compensation network (for instance, one or more compensation capacitors, compensation resistors, and/or other compensation components).

Tuning the transconductance of TIAs can significantly improve matching between I and Q paths of a wideband transmitter or receiver in a more effective manner than controlling the feedback capacitance of amplifiers.

The analog gain adjustment can be combined with digital QEC techniques to provide further performance enhancement. For example, deploying QEC in digital domain can be robust and effective, and performing additional QEC in the analog domain via amplifier gain adjustments can relax the requirements on the digital algorithm that performs QEC correction. Moreover, multiple analog gain adjustment techniques (with or without digital QEC), such as a combination of amplifier gain tuning and feedback capacitor tuning, can be utilized.

The transceivers herein can handle signals of a variety of frequencies, including not only RF signals between 30 MHz and 7 GHz, but also signals of higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave systems.

FIG. 1 is a schematic diagram of one embodiment of an RF communication system 30. The RF communication system 30 includes a transceiver 1, a front-end system 2, and an antenna 3.

In the illustrated embodiment, the transceiver 1 includes a transmitter 5, a receiver 6, and a QEC circuit 7. Although not depicted in FIG. 1, the transceiver 1 can also include other circuitry, for example, observation receivers, control circuits, calibration circuits, and/or additional transmitters and/or receivers. In certain implementations, the transceiver 1 is implemented on a separate semiconductor die or chip than the front-end system 2.

Although FIG. 1 depicts the transceiver 1 as including one transmitter and one receiver, the transceiver can include additional transmitter(s) and/or receiver(s). For instance, for certain applications, such as massive multi-input multiple-output (MIMO) applications, the transceiver 1 can include a large number of transmitters and receivers, for example, 8 or more transmitters, 8 or more receivers, and at least one observation receiver.

In the illustrated embodiment, the transmitter 5 includes an I-path DAC 11a, an I-path controllable amplifier 12a, an I-path mixer 13a, a Q-path DAC 11b, a Q-path controllable amplifier 12b, a Q-path mixer 13b, and a transmit local oscillator (LO) 14. Although one example of transmitter circuitry is depicted, a transmitter can be implemented in other ways.

With respect to signal transmission, the I-path DAC 11a converts a digital I signal to an analog I signal, which is amplified by the I-path controllable amplifier 12a. Additionally, the Q-path DAC 11b converts a digital Q signal to an analog Q signal, which is amplified by the Q-path controllable amplifier 12b. The transmit LO 14 provides an I-path clock signal to the I-path mixer 13a, which upconverts the amplified analog I signal. The transmit LO 14 further provides a Q-path clock signal to the Q-path mixer 13b, which upconverts the amplified analog Q signal. The outputs of the I-path mixer 13a and the Q-path mixer 13b are combined to generate an RF transmit signal TX that is provided to the front-end system 2.

With continuing reference to FIG. 1, the receiver 6 includes an I-path ADC 21a, an I-path controllable amplifier 22a, an I-path mixer 23a, a Q-path ADC 21b, a Q-path controllable amplifier 22b, a Q-path mixer 23b, and a receive LO 24. Although one example of receiver circuitry is depicted, a receiver can be implemented in other ways.

With respect to signal reception, the receiver 6 receives an RF receive signal RX from the front-end system 2. The receive LO 24 provides an I-path clock signal to the I-path mixer 23a and a Q-path clock signal to the Q-path mixer 23b. The I-path mixer 23a downconverts the RF receive signal RX using the I-path clock signal to generate an analog I signal. The analog I signal is amplified by the I-path controllable amplifier 22a and digitized by the I-path ADC 21a to generate a digital I signal. The Q-path mixer 23b downconverts the RF receive signal RX using the Q-path clock signal to generate an analog Q signal. The analog Q signal is amplified by the Q-path controllable amplifier 22b and digitized by the Q-path ADC 21b to generate a digital Q signal.

As shown in FIG. 1, the QEC circuit 7 separately controls a gain of the transmitter's I-path controllable amplifier 12a and Q-path controllable amplifier 12b, as well as a gain of the receiver's I-path controllable amplifier 22a and Q-path controllable amplifier 22b.

In particular, the QEC circuit 7 controls the transmitter's I-path controllable amplifier 12a with the I-path transmit gain control signal $GAIN_{TI}$, controls the transmitter's Q-path controllable amplifier 12b with the Q-path transmit gain control signal $GAIN_{TQ}$, controls the receiver's I-path controllable amplifier 22a with the I-path receive gain control signal $GAIN_{RI}$, and controls the receiver's Q-path controllable amplifier 22b with the Q-path receive gain control signal $GAIN_{RQ}$.

Examples of types of gain control that can be performed by the QEC circuit 7 include, but are not limited to, adjustment of bias current, adjustment of amplifier size (for instance, a transistor width or a number of active transistors), and/or adjustment of a frequency compensation network.

The transceiver 1 can be implemented in accordance with any of the embodiments herein. Although the RF communication system 30 of FIG. 1 illustrates one embodiment of an RF communication system that can include a transceiver, the teachings herein are applicable to transceivers implemented in a wide variety of communication system. Accordingly, other implementations are possible.

As shown in FIG. 1, the front-end system 2 includes a power amplifier 27 that amplifies the RF transmit signal TX for transmission on the antenna 3, and a low noise amplifier 28 that generates the RF receive signal RX based on amplifying a received signal from the antenna 3. Although only the power amplifier 27 and the low noise amplifier 28 are depicted, the front-end system 2 can include other components including, but not limited to, filters, switches, duplexers, diplexers, couplers, and/or other components. Moreover, transmit and receive channels need not share an antenna, but rather can use separate antennas.

Figure 2:
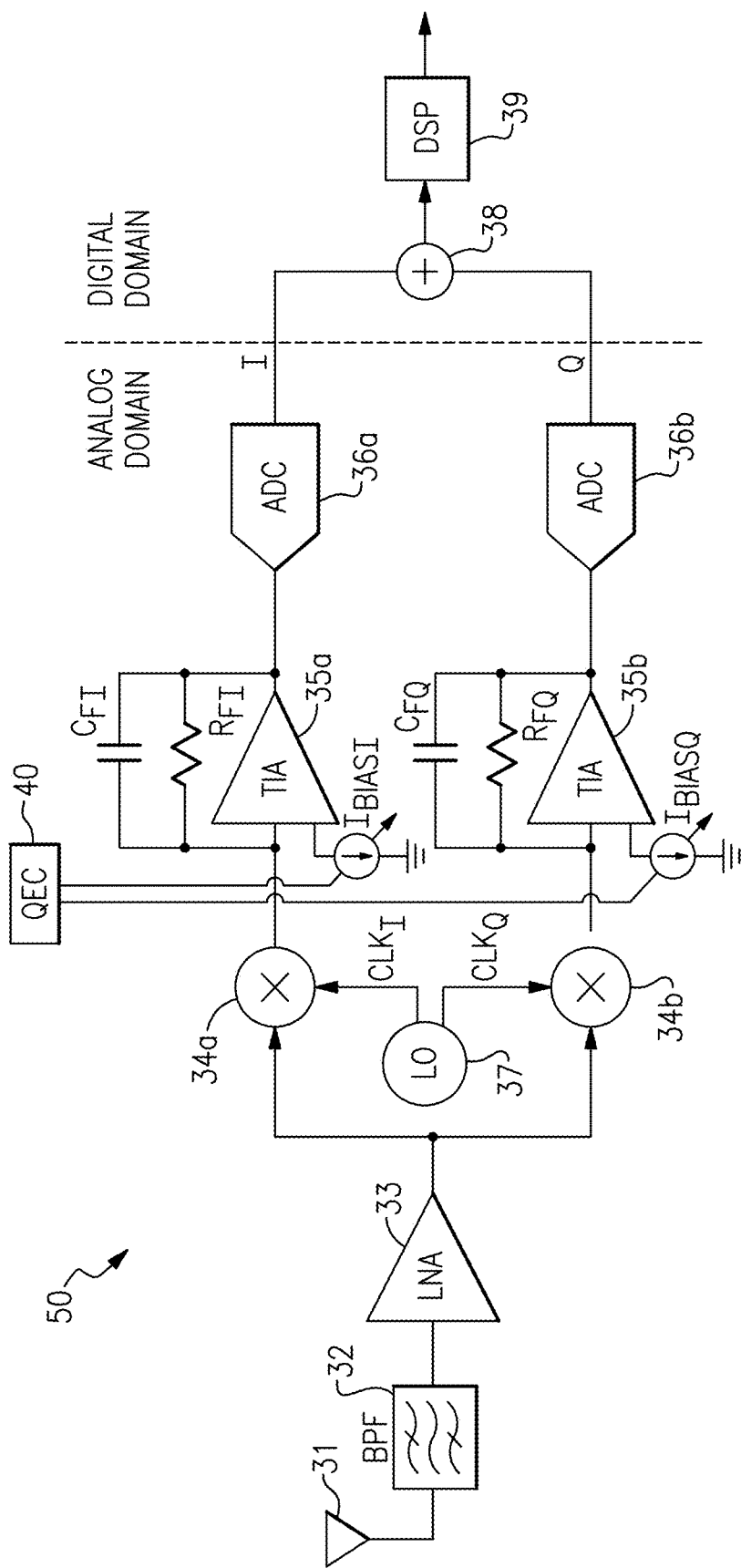
FIG. 2 is a schematic diagram of another embodiment of a receive channel of an RF communication system.

FIG. 2 is a schematic diagram of another embodiment of a receive channel 50 of an RF communication system. The receive channel 50 includes an antenna 31, a bandpass filter 32, a low noise amplifier 33, a local oscillator 37, an I-path mixer 34a, an I-path TIA 35a, an I-path feedback resistor $R_{FI}$, an I-path feedback capacitor $C_{FI}$, an I-path bias current source $I_{BIASI}$, an I-path ADC 36a, a Q-path mixer 34b, a Q-path TIA 35b, a Q-path feedback resistor $R_{FQ}$, a Q-path feedback capacitor $C_{FQ}$, a Q-path bias current source $I_{BIASQ}$, a Q-path ADC 36b, a digital adder 38, a digital signal processor (DSP) 39, and a QEC circuit 40. Although depicted as being in the analog domain, the QEC circuit 40 can be implemented in the analog domain and/or digital domain.

The receive channel 50 depicts a receiver architecture in which the RF signal is first processed in the analog domain followed by signal processing in the digital domain. Mismatch results from technology process variations between the I and Q paths which causes an image to appear at the output of the receiver (for example, in data outputted by the DSP 39). Such mismatch deteriorates the dynamic range and performance of the overall receiver.

QEC can alleviate the mismatch by deliberately changing the characteristics of one path (one of the I path or the Q path) with respect to the other path (the other of the I path or the Q path) to align the responses of the I and Q paths. The quality of matching between the two paths can be measured by image-rejection ratio (IMRR), as set forth in Equation 1 below in which higher IMRR represents better matching.

$$IMRR = 20 \ \log_{10}\left|\frac{v_I + v_Q}{v_I - v_Q}\right| \quad \text{Equation 1}$$

In the illustrated embodiment, the I-path TIA is biased by the I-path bias current source $I_{BIASI}$, while and the Q-path TIA is biased by the Q-path bias current source $I_{BIASQ}$. The amount of current provided by $I_{BIASI}$ and $I_{BIASQ}$ can be separately controlled by the QEC circuit 40 to control a gain of the I-path TIA relative to a gain of the Q-path TIA. By providing adjustments to the gain of each TIA, QEC can be provided in accordance with the teachings herein.

Although an example of amplifier gain adjustment by adjusting bias current is depicted, the teachings herein are applicable to other techniques for adjusting amplifier gain. Thus, the gain of TIAs can be controlled in other ways than by bias current.

One example discussion related to QEC by tuning amplifier gain is now provided.

In a non-ideal TIA, the new value of cut-off frequency ($f_c$) is scaled by a factor $\alpha$ such that $f_c = \alpha/(2\pi R_F C_F)$, where $\alpha$ is given by Equation 2 below in which $R_m$ is the impedance looking back into the mixer (for example, mixer 34a for the I-path), $C_{in}$ is the total input capacitance seen at the input of the TIA (for example, TIA 35a for the I-path), and A(f) is the gain of the TIA as a function of frequency (f).

$$\alpha = \frac{1 + \dfrac{1 + R_f/R_m}{A(f)}}{1 + \dfrac{1 + C_{in}/C_f}{A(f)}} \quad \text{Equation 2}$$

In a typical design, the gain of the amplifier is made sufficiently high at low frequencies, which causes $\alpha$ to approach unity. In this case, tuning $C_F$ is likely the most effective way to tune the frequency responses to match the I and Q paths at frequencies of interest.

However, at higher frequencies the loop gain of the amplifier drops especially in wideband transceivers where the loop gain at higher frequencies is limited by budgeted power consumption and technology speed limitations. In addition, the parasitic capacitance from the circuit and from routing limits the granularity of the unit capacitance to perform the tuning in the analog domain.

Thus, a major contributor to I/Q mismatch in any transmitter or receiver is the gain of the TIA especially at higher frequencies where loop gain drops and effect of gain mismatch becomes more pronounced. The gain of the TIA, which is frequency-dependent in wideband transceivers, is a strong function of the transconductance.

In certain embodiments herein, A(f) of an I-path is adjusted relative to A(f) of a Q-path (for instance, by controlling bias current, amplifier size, and/or a compensation network) to provide QEC.

Figure 3A:
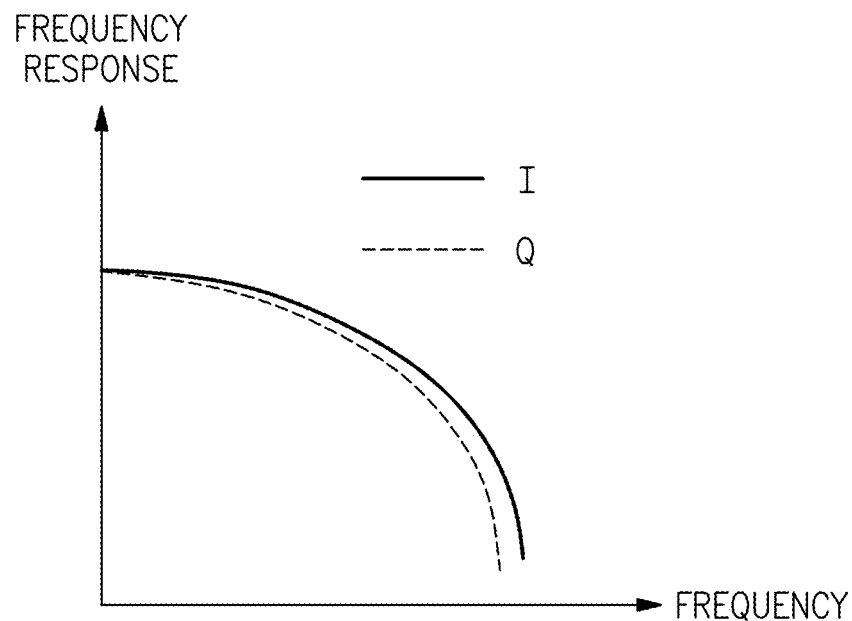
FIG. 3A is a graph of one example of in-phase (I) and quadrature-phase (Q) response versus frequency for one implementation of a receiver without quadrature error correction (QEC).
Figure 3B:
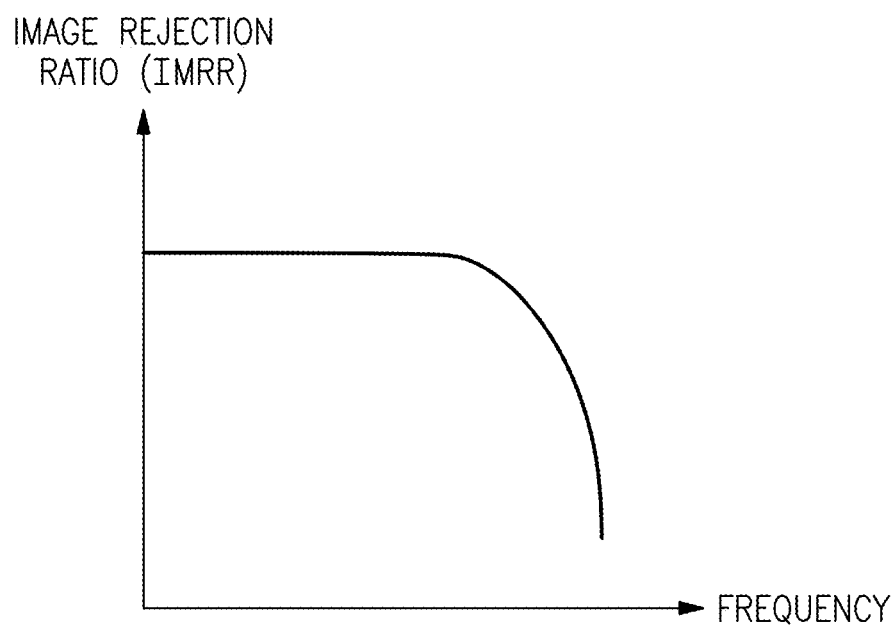
FIG. 3B is a graph of one example of image-rejection ratio (IMRR) versus frequency for one implementation of a receiver without QEC.

FIG. 3A is a graph of one example of I and Q response versus frequency for one implementation of a receiver without QEC. FIG. 3B is a graph of one example of IMRR versus frequency for one implementation of a receiver without QEC.

As shown in FIGS. 3A and 3B, imbalance in I and Q paths can lead to quadrature error and a corresponding degradation in IMRR.

Figure 4:
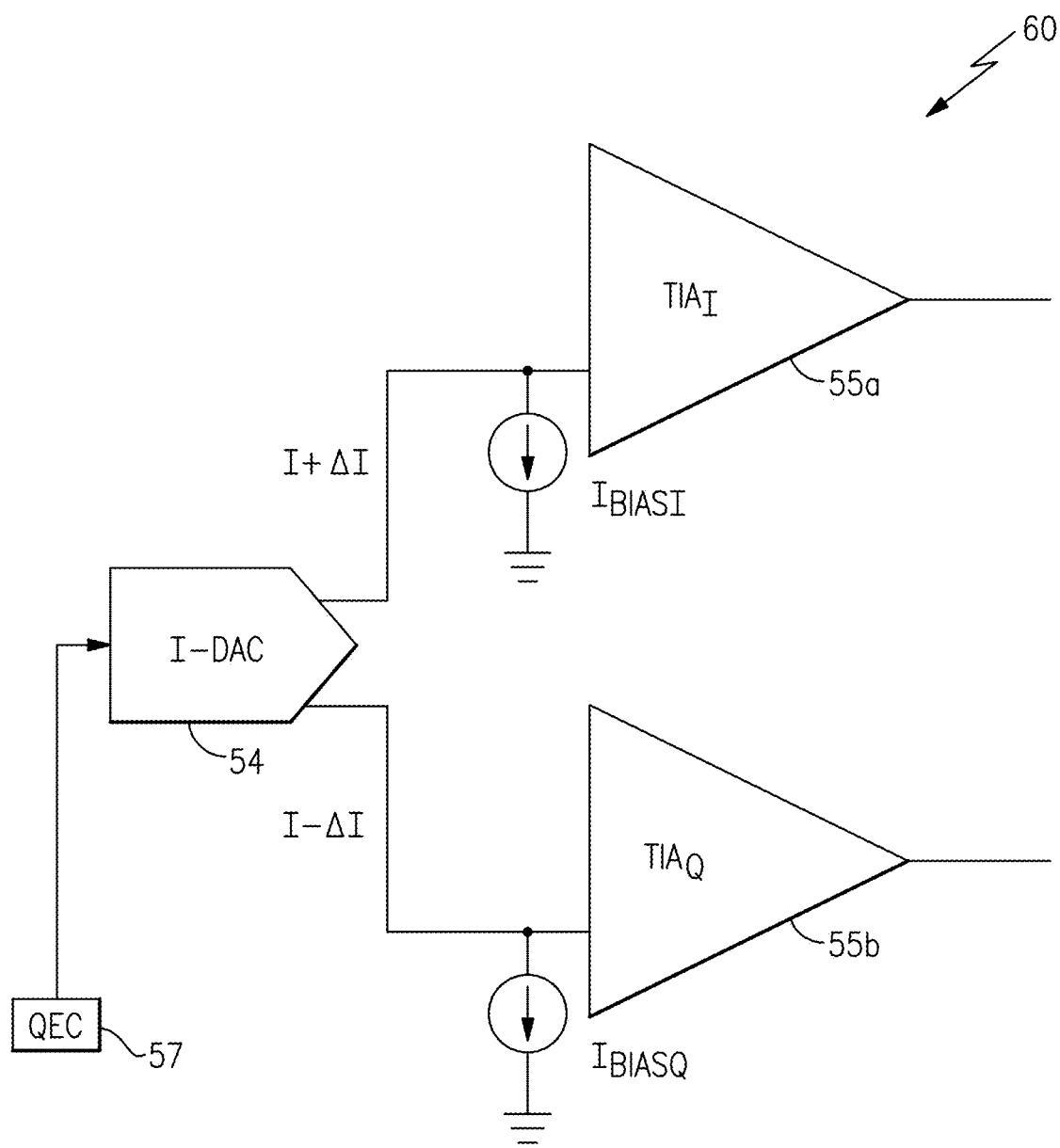
FIG. 4 is a schematic diagram of another embodiment of a portion of a receiver with QEC.

FIG. 4 is a schematic diagram of another embodiment of a portion of a receiver 60 with QEC. The portion of the receiver 60 includes a current steering digital-to-analog converter (I-DAC) 54, an I-path TIA 55a, an I-path bias current source $I_{BIASI}$, a Q-path TIA 55b, a Q-path bias current source $I_{BIASQ}$, and a QEC circuit 57.

In this embodiment, the transconductance of the TIAs 55a and 55b are adjusted at the frequency range of interest with predictable resolution using the I-DAC 54, which adds or subtracts bias current from one TIA while subtracting or adding bias current from the other TIA. Using the I-DAC 54 provides fine control over TIA gains.

Such current steering using the I-DAC 54 can be provided in addition to or as an alternative to separately controlling the I-path bias current source $I_{BIASI}$ relative to the Q-path bias current source $I_{BIASQ}$.

In the illustrated embodiment, the QEC circuit 57 provides digital control data for setting the amount of current ΔI steered from one TIA to the other TIA.

Figure 5A:
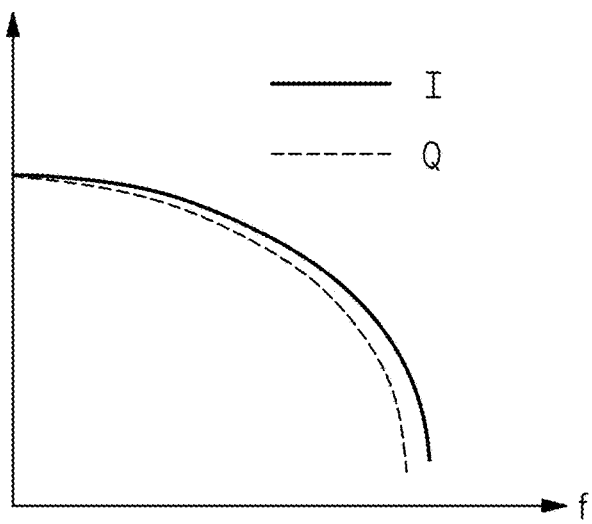
FIG. 5A is a graph of one example of gain versus frequency for one implementation of a receiver before QEC.
Figure 5B:
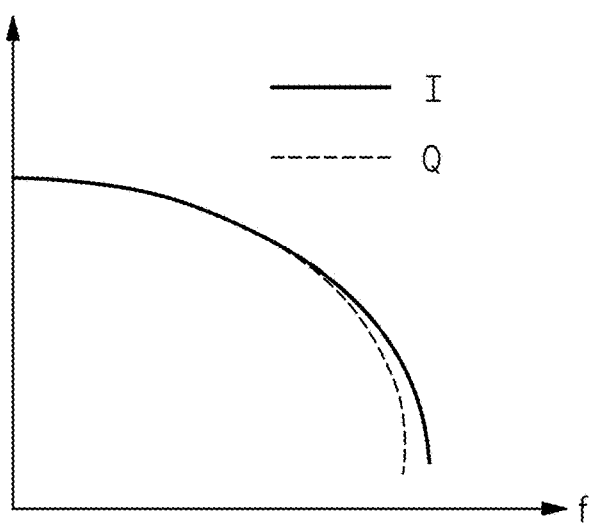
FIG. 5B is a graph of one example of gain versus frequency for one implementation of a receiver after QEC.

FIG. 5A is a graph of one example of gain versus frequency for one implementation of a receiver before QEC. FIG. 5B is a graph of one example of gain versus frequency for one implementation of a receiver after QEC. In this example, QEC is provided using one implementation of an I-DAC.

Using the bias current of the amplifier as a variable to change the transconductance can result in much finer resolution due to simple controllability and reduced parasitic sensitivity of DC bias current, which allows better matching in wideband transceivers in which loop gain at high frequencies is not sufficient. Using transconductance tuning along with feedback-capacitance tuning can significantly enhance the QEC and reduce mismatch between the I and Q paths.

Figure 6:
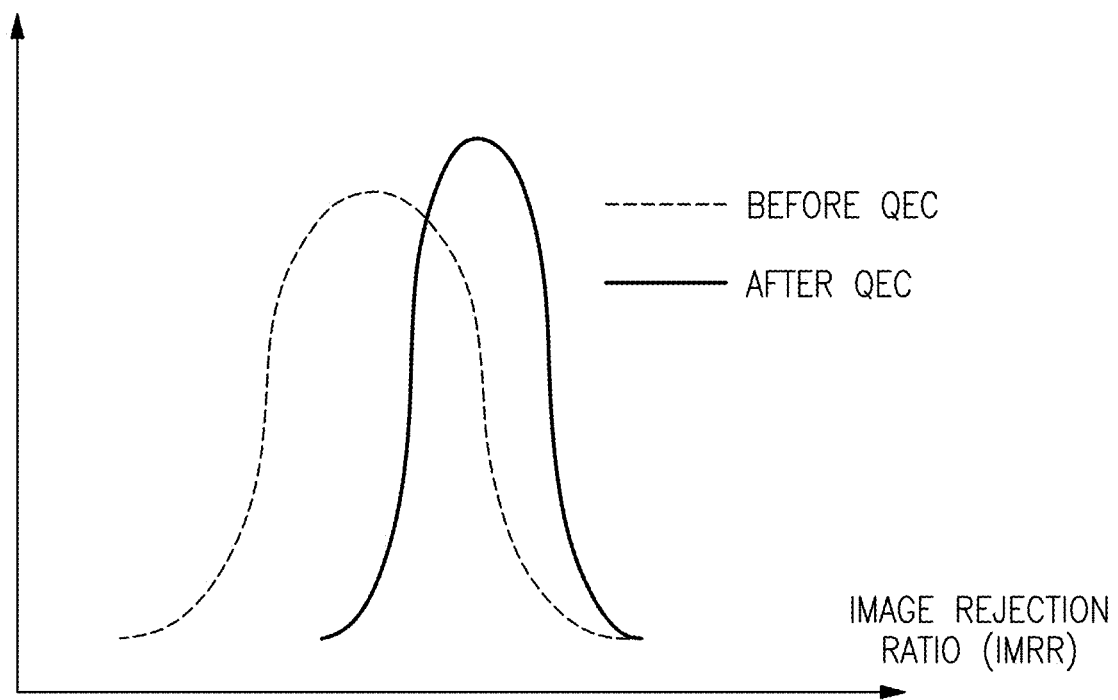
FIG. 6 is a graph of one example of plots of IMRR versus frequency before and after QEC correction.

FIG. 6 is a graph of one example of plots of IMRR versus frequency before and after QEC correction. In particular, FIG. 6 depicts an example statistical distribution of the IMRR from random Monte Carlo simulations based on statistical models of the circuit components before and after applying QEC. By using QEC, reduction in both the mean and worst case values of IMRR is achieved.

Figure 7:
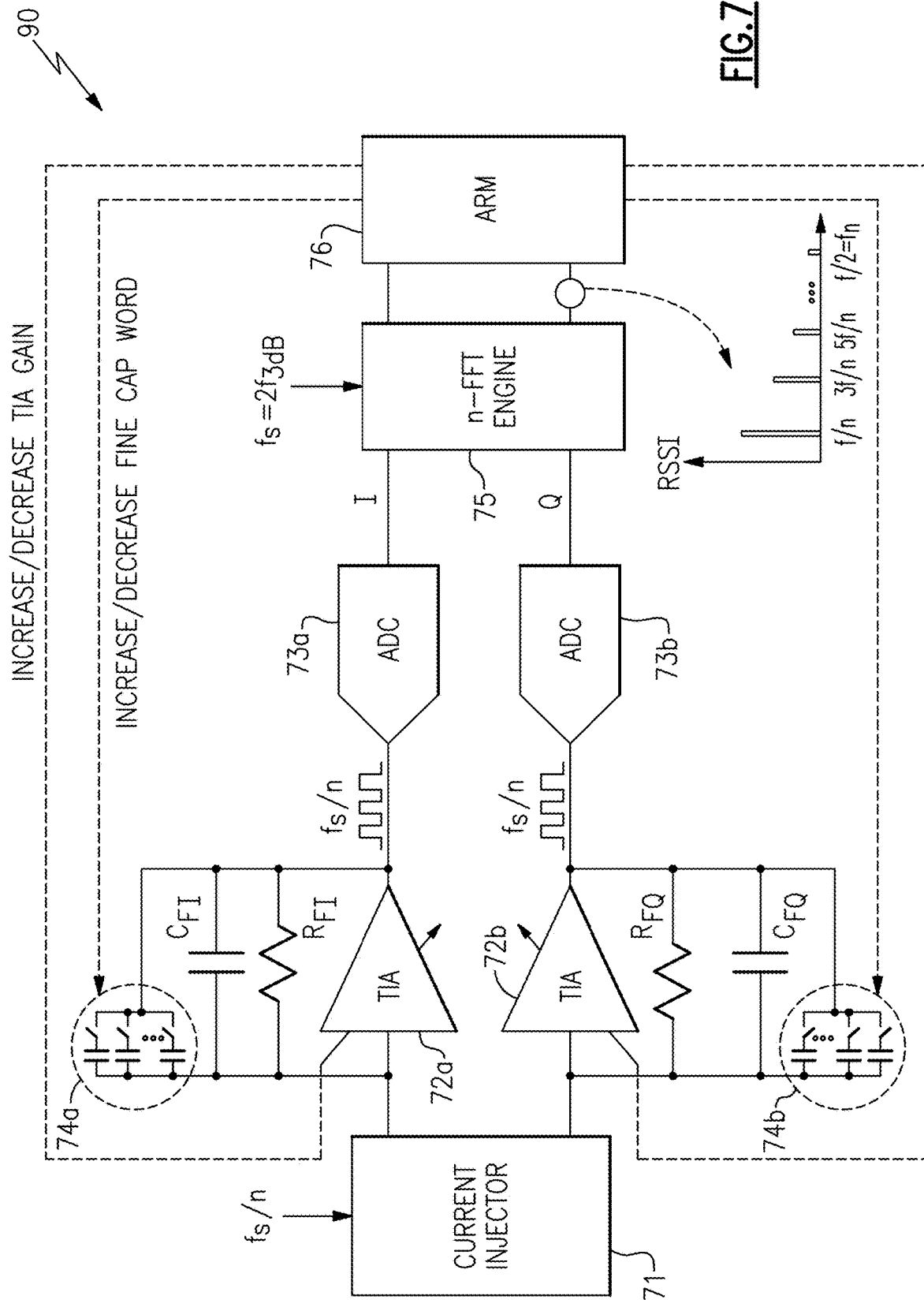
FIG. 7 is a schematic diagram of one embodiment of a receiver using a combination of feedback capacitor tuning and amplifier gain tuning.

FIG. 7 is a schematic diagram of one embodiment of a receiver 90 using a combination of feedback capacitor tuning and amplifier gain tuning. By using feedback capacitor tuning in combination with amplifier gain tuning, further performance enhancement is achieved.

As shown in FIG. 7, the receiver 90 includes a current injector 71, an I-path controllable TIA 72a, an I-path feedback capacitor $C_{FI}$, an I-path feedback resistor $R_{FI}$, an I-path controllable feedback capacitor 74a (implemented as a bank of switch selectable capacitors each in parallel with $C_{FI}$), an I-path ADC 73a, a Q-path controllable TIA 72b, a Q-path feedback capacitor $C_{FQ}$, a Q-path feedback resistor $R_{FQ}$, a Q-path controllable feedback capacitor 74b (implemented as a bank of switch selectable capacitors each in parallel with $C_{FQ}$), a Q-path ADC 73b, a fast Fourier transform engine 75, and a processor 76 (ARM, in this example).

Feedback capacitor tuning can be associated with QEC by varying the feedback capacitance of the amplifier in both I and Q paths until the frequency responses match to a certain degree.

In this example, current is injected at the input of each TIA 72a/72b at frequency $f_s/2$ where $f_s$ is the sampling frequency of the subsequent FFT engine 75 following the ADCs 73a/73b. The sampling frequency is set at the 3 dB frequency of the filter (for example, a bandpass filter, such as the bandpass filter 32 of FIG. 2) to ensure that the resulting FFT bins cover the entire bandwidth of the receiver 90.

The RSSI error is evaluated by subtracting the corresponding FFT bins of the I and Q paths. For example, one expression for RSSI is given by Equation 3 below.

$$RSSI = \sqrt{\sum_{k=1,3,\ldots n/2} (A_{I,k}^2 - A_{Q,k}^2)} \qquad \text{Equation 3}$$

Subsequently, the ARM processor 76 is used to set the fine capacitance control words of the controllable feedback capacitors 74a/74b to achieve about the lowest amount of (for instance, minimize) mismatch between the two paths. A typical frequency of interest in the transmitter/receiver path is usually the cut-off frequency ($f_c$) of the amplifier set by the feedback resistor and capacitor. In an ideal TIA for example, the value of $f_c$ is equal to $1/(2\pi R_F C_F)$ where $R_F$ and $C_F$ are the feedback resistance and capacitance, respectively. More often than not, there is a limitation on the resolution of the feedback capacitance determined by the amount of parasitic capacitance from the circuit and from routing.

The ARM processor 76 also controls the gain of the I-path TIA 72a and the Q-path TIA 72b, in this example.

Figure 8A:
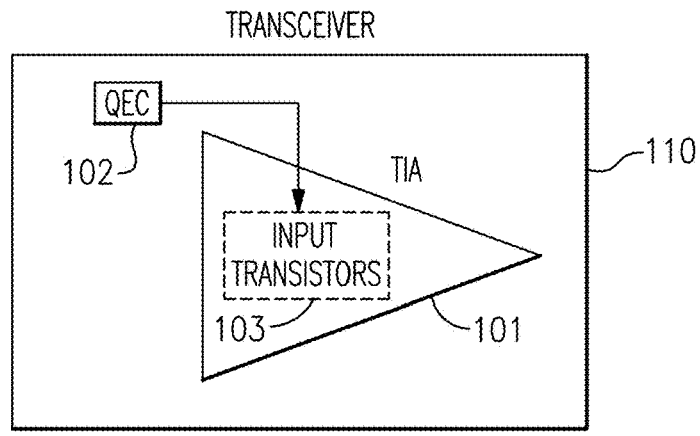
FIG. 8A is a schematic diagram of one embodiment of gain control for a transimpedance amplifier (TIA) of a transceiver.

FIG. 8A is a schematic diagram of one embodiment of gain control for a TIA 101 of a transceiver 110. In the illustrated embodiment, a QEC circuit 102 controls a gain of the TIA 101 by adjusting a pair of input transistors 103 of the TIA 101 to thereby adjust the TIA's size. For example, the pair of input transistors 103 can have a width and/or number of active transistor elements that are selectable by the QEC circuit 102 to control gain.

Figure 8B:
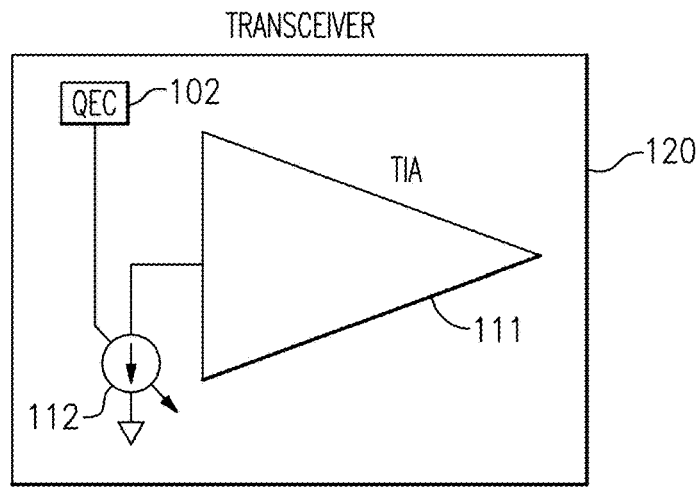
FIG. 8B is a schematic diagram of another embodiment of gain control for a TIA of a transceiver.

FIG. 8B is a schematic diagram of another embodiment of gain control for a TIA 111 of a transceiver 120. In the illustrated embodiment, a QEC circuit 102 controls a gain of the TIA 111 by adjusting a bias current 112 of the TIA 111.

Figure 8C:
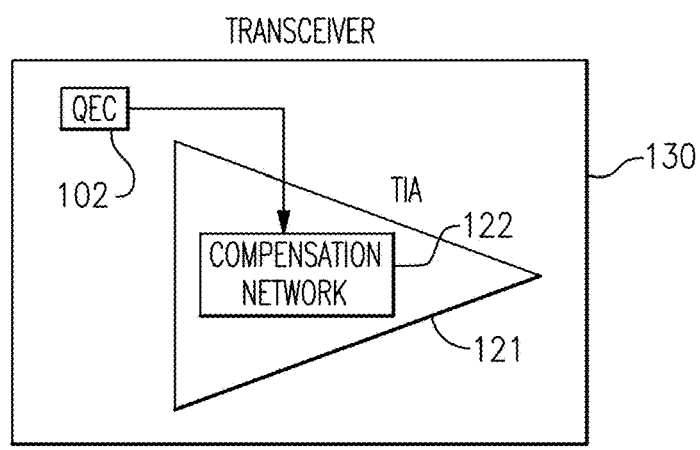
FIG. 8C is a schematic diagram of another embodiment of gain control for a TIA of a transceiver.

FIG. 8C is a schematic diagram of another embodiment of gain control for a TIA 121 of a transceiver 130. In the illustrated embodiment, a QEC circuit 102 controls a gain of the TIA 121 by adjusting a controllable frequency compensation network 122 of the TIA 121 to thereby adjust the TIA's gain. Controlling the frequency compensation network 122 can include adjusting one or more compensation capacitors, one or more compensation resistors, and/or one or more other components providing frequency compensation to the TIA 121.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments.

Accordingly, the scope of the present invention is defined only by reference to the appended claims. Although the claims presented here are in single dependency format for filing at the USPTO, it is to be understood that any claim may depend on any preceding claim of the same type except when that is clearly not technically feasible.

What is claimed is:

1. A transceiver with quadrature error correction (QEC), the transceiver comprising:
   an in-phase (I) signal path including a first transimpedance amplifier coupled to a first data converter and configured to receive a first input current at a first input and to output a first output voltage at a first output, the I signal path further including a first resistor and a first capacitor connected in parallel with one another between the first input and the first output;
   a quadrature-phase (Q) signal path including a second transimpedance amplifier coupled to a second data converter and configured to receive a second input current and to output a second output voltage, the Q signal path further including a second resistor and a second capacitor connected in parallel with one another between a second input and a second output; and
   a QEC circuit configured to correct for a quadrature error between the I signal path and the Q signal path by adjusting a gain of at least one of the first transimpedance amplifier or the second transimpedance amplifier.

2. The transceiver of claim 1, wherein the QEC circuit is operable to control a transconductance of the first transimpedance amplifier and a transconductance of the second transimpedance amplifier.

3. The transceiver of claim 1, wherein the QEC circuit includes a current steering digital-to-analog converter including a first output coupled to the first input of the first transimpedance amplifier and a second output coupled to the second input of the second transimpedance amplifier.

4. The transceiver of claim 1, wherein the QEC circuit is configured to further correct for the quadrature error by controlling an amount of feedback capacitance of the first transimpedance amplifier and an amount of feedback capacitance of the second transimpedance amplifier.

5. The transceiver of claim 1, wherein the QEC circuit is configured to adjust the gain by controlling an amplifier size of at least one of the first transimpedance amplifier or the second transimpedance amplifier.

6. The transceiver of claim 1, wherein the QEC circuit is configured to adjust the gain by controlling a bias current of at least one of the first transimpedance amplifier or the second transimpedance amplifier.

7. The transceiver of claim 1, wherein the QEC circuit is configured to adjust the gain by controlling an amount of frequency compensation of at least one of the first transimpedance amplifier or the second transimpedance amplifier.

8. The transceiver of claim 1, wherein the first data converter is a first digital-to-analog converter (DAC) and the second data converter is a second DAC, wherein an output of the first DAC is coupled to the first input of the first transimpedance amplifier and an output of the second DAC is coupled to the second input of the second transimpedance amplifier.

9. The transceiver of claim 8, further comprising a first upconverting mixer having an input coupled to the first output of the first transimpedance amplifier, and a second upconverting mixer having an input coupled to the second output of the second transimpedance amplifier.

10. The transceiver of claim 1, wherein the first data converter is a first analog-to-digital converter (ADC) and the second data converter is a second ADC, wherein an input of the first ADC is coupled to the first output of the first amplifier and an input of the second ADC is coupled to the second output of the second amplifier.

11. The transceiver of claim 10, further comprising a first downconverting mixer having an output coupled to the first input of the first amplifier, and a second downconverting mixer having an output coupled to the second input of the second amplifier.

12. A method of quadrature error correction (QEC) in a transceiver, the method comprising:
    processing an in-phase (I) signal using an I signal path that includes a first amplifier coupled to a first data converter;
    processing a quadrature-phase (Q) signal using a Q signal path that includes a second amplifier coupled to a second data converter; and
    correcting for a quadrature error between the I signal path and the Q signal path by adjusting a gain of at least one of the first amplifier or the second amplifier and by controlling at least one of an amount of feedback capacitance of the first amplifier or an amount of feedback capacitance of the second amplifier.

13. The method of claim 12, wherein the first amplifier is a first transimpedance amplifier and the second amplifier is a second transimpedance amplifier, the method further comprising receiving a first input current and outputting a first output voltage using the first transimpedance amplifier, and receiving a second input current and outputting a second output voltage using the second transimpedance amplifier.

14. The method of claim 13, wherein correcting for the quadrature error includes controlling a transconductance of the first transimpedance amplifier and controlling a transconductance of the second transimpedance amplifier.

15. The method of claim 13, wherein correcting for the quadrature error further includes steering the first input current to the first input of the first transimpedance amplifier and the second input current to the second input of the second transimpedance amplifier using a current steering DAC.

16. A radio frequency (RF) communication system comprising:
   a transceiver comprising:
      an in-phase (I) signal path including a first amplifier coupled to a first data converter;
      a quadrature-phase (Q) signal path including a second amplifier coupled to a second data converter; and
      a quadrature error correction (QEC) circuit configured to correct for a quadrature error between the I signal path and the Q signal path by adjusting a gain of at least one of the first amplifier or the second amplifier, wherein the QEC circuit includes a current steering digital-to-analog converter including a first output coupled to an input of the first amplifier and a second output coupled to an input of the second amplifier; and
   a front-end system configured to receive an RF transmit signal from the transceiver and to provide an RF receive signal to the transceiver.

17. The RF communication system of claim 16, wherein the first amplifier is a first transimpedance amplifier configured to receive a first input current and to output a first output voltage, and the second amplifier is a second transimpedance amplifier configured to receive a second input current and to output a second output voltage.

18. The RF communication system of claim 16, wherein the QEC circuit is configured to further correct for the quadrature error by controlling an amount of feedback capacitance of at least one of the first amplifier or the second amplifier.

19. The RF communication system of claim 16, wherein the QEC circuit is configured to adjust the gain by controlling an amount of frequency compensation of at least one of the first amplifier or the second amplifier.

20. The RF communication system of claim 16, wherein the QEC circuit is configured to adjust the gain by controlling a bias current of at least one of the first amplifier or the second amplifier.

* * * * *